(12) United States Patent
Okuchi

(10) Patent No.: US 8,148,175 B2
(45) Date of Patent: Apr. 3, 2012

(54) MANUFACTURING APPARATUS FOR SEMICONDUCTOR DEVICE AND MANUFACTURING METHOD FOR SEMICONDUCTOR DEVICE

(75) Inventor: Hisashi Okuchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 338 days.

(21) Appl. No.: 12/591,154

(22) Filed: Nov. 10, 2009

(65) Prior Publication Data

US 2010/0136716 A1 Jun. 3, 2010

Related U.S. Application Data

(62) Division of application No. 12/133,023, filed on Jun. 4, 2008, now Pat. No. 7,635,397.

(30) Foreign Application Priority Data

Jun. 5, 2007 (JP) ................. P2007-149485

(51) Int. Cl.
*H01L 21/66* (2006.01)
(52) U.S. Cl. ............. 438/5; 438/757; 257/E21.219; 257/E21.251; 257/E21.525
(58) Field of Classification Search .......... 438/5, 757, 438/FOR. 141; 29/25.01; 257/E21.219, 257/E21.251, E21.525
See application file for complete search history.

(56) References Cited

U.S. PATENT DOCUMENTS

| 5,830,375 | A * | 11/1998 | Huang et al. ............ 216/84 |
| 6,001,215 | A | 12/1999 | Ban |
| 6,326,313 | B1 * | 12/2001 | Couteau et al. ........... 438/745 |
| 6,376,261 | B1 * | 4/2002 | Campbell ............... 438/8 |
| 6,399,517 | B2 | 6/2002 | Yokomizo et al. |
| 6,780,277 | B2 | 8/2004 | Yokomizo et al. |
| 2003/0011774 | A1 * | 1/2003 | DiBello et al. ........... 356/436 |
| 2005/0067101 | A1 * | 3/2005 | Funabashi ............ 156/345.18 |
| 2005/0159011 | A1 * | 7/2005 | Thirumala et al. ......... 438/745 |
| 2005/0263488 | A1 * | 12/2005 | Change et al. ............. 216/83 |
| 2008/0035609 | A1 * | 2/2008 | Kashkoush et al. .......... 216/84 |

FOREIGN PATENT DOCUMENTS

| JP | 9-275091 | 10/1997 |
| JP | 2001-23952 | 1/2001 |
| JP | 2004-288963 | 10/2004 |

OTHER PUBLICATIONS

Notification of Reason(s) for Refusal issued by the Japanese Patent Office on Apr. 14, 2009, for Japanese Patent Application No. 2007-149465, and English-language translation thereof.

* cited by examiner

*Primary Examiner* — George Fourson, III
(74) *Attorney, Agent, or Firm* — Finnegan, Henderson, Farabow, Garrett & Dunner, L.L.P.

(57) ABSTRACT

A manufacturing apparatus for a semiconductor device, treating a SiN film formed on a wafer with phosphoric acid solution, including a processing bath to store phosphoric acid solution provided for treatment of the wafer, a control unit for calculating integrated SiN etching amount of the phosphoric acid solution, determining necessity of quality adjustment of the phosphoric acid solution, based on correlation between the integrated SiN etching amount calculated and etching selectivity to oxide film, and calculating a quality adjustment amount of the phosphoric acid solution as needed, and also including a mechanism to adjust the quality of the phosphoric acid solution based on the quality adjustment amount calculated.

12 Claims, 5 Drawing Sheets

MANUFACTURING APPARATUS FOR SEMICONDUCTOR DEVICE AND MANUFACTURING METHOD FOR SEMICONDUCTOR DEVICE

This is a division of application Ser. No. 12/133,023, filed Jun. 4, 2008, now U.S. Pat. No. 7,635,397, which is incorporated herein by reference.

CROSS-REFERENCE TO RELATED APPLICATIONS

This application is based upon and claims the benefit of priority from the prior Japanese Patent Application No. 2007-149465 filed on Jun. 5, 2007, the entire contents of which are incorporated herein by reference.

BACKGROUND OF THE INVENTION

1. Field of the Invention

The present invention relates to a manufacturing apparatus for a semiconductor device and a manufacturing method for a semiconductor device, used for etching treatment of a semiconductor substrate, for example, with phosphoric acid solution.

2. Description of the Related Art

In the manufacturing processes of semiconductor devices, there is a process of etching a silicon nitride (SiN) film formed on a wafer with phosphoric acid solution, hereinafter referred to as "$H_3PO_4$ solution". This process uses a batch processing bath subjected to etching treatment, for example, with a plurality of wafers as one lot. Usually, $H_3PO_4$ solution is maintained at a temperature of approximately 160° C. next to boiling point in the processing bath, and is used while being circulated for treatment of a plurality of lots.

When etching treatment of a SiN film formed on a wafer using $H_3PO_4$ solution is performed in the batch processing bath, etching residue resulting from silica ($SiO_2$) generated by an etching reaction remains in the $H_3PO_4$ solution. By circulating the $H_3PO_4$ solution and repeatedly using the solution for $H_3PO_4$ treatment, etching residue gathers in the $H_3PO_4$ solution as the number of lots to be treated increases, and the amount of etching residue increases.

The etching residue causes dust generation and fluctuates SiN etching rate and etching selectivity to oxide film with the amount of etching residue gathered in $H_3PO_4$ solution. Accordingly, to restrain process fluctuations, there have been studied various methods for controlling the concentration of etching residue (Si concentration) dissolved in $H_3PO_4$ solution.

For example, U.S. Pat. No. 6,780,277 has disclosed a method for additionally supplying $H_3PO_4$ solution by directly monitoring Si concentration in $H_3PO_4$ solution and discarding a required amount of solution when the concentration has reached a predetermined concentration. For this method, a dedicated Si concentration measurement unit for measuring Si concentration in high-temperature $H_3PO_4$ solution with the in-situ technique is essential. However, such a unit exists in reality, but is very expensive and has questionable reliability.

There has been known a method for controlling Si concentration in $H_3PO_4$ solution to have a desired concentration by adding an appropriate amount of hydrofluoric acid (HF) into $H_3PO_4$ solution and vaporizing $SiO_2$ by reaction with HF. This method requires measurement of Si concentration in $H_3PO_4$ solution. However, it is difficult to control $H_3PO_4$ solution in real time, as described above.

US2005/0263488 has disclosed a method for re-precipitating silicate by cooling $H_3PO_4$ solution and removing the re-precipitated silicate by filtration. However, the method requires use of a dedicated cooling system.

Japanese Patent Application Laid-Open No. 2004-288963 (paragraph numbers [0030] to [0033], FIG. 3 and others) has proposed a method for determining a current etching rate of $H_3PO_4$ solution based on the use history of $H_3PO_4$ solution up to now and data showing a relationship between the use history and etching rate and correcting etching time in accordance with the etching rate. This method requires no actual measurement of Si concentration by the in-situ technique during etching treatment.

However, this method allows completion of etching treatment of a desired depth, but requires long treatment time and therefore a desired aperture shape may be difficult to obtain due to a relationship with etching selectivity to oxide film.

SUMMARY OF THE INVENTION

In accordance with a first aspect of the present invention, a manufacturing apparatus for a semiconductor device, treating a SiN film formed on a wafer with phosphoric acid solution, including a processing bath to store phosphoric acid solution provided for treatment of the wafer, a control unit for calculating integrated SiN etching amount of the phosphoric acid solution, determining necessity of quality adjustment of the phosphoric acid solution, based on correlation between the integrated SiN etching amount calculated and etching selectivity to oxide film, and calculating a quality adjustment amount of the phosphoric acid solution as needed, and also including a mechanism to adjust the quality of the phosphoric acid solution based on the quality adjustment amount calculated.

In accordance with a second aspect of the present invention, A manufacturing method for a semiconductor device treating a SiN film formed on a wafer is treated with phosphoric acid solution, including calculating integrated SiN etching amount of phosphoric acid solution provided for treatment of the wafer, determining necessity of quality adjustment of the phosphoric acid solution based on correlations between the integrated SiN etching amount calculated and etching selectivity to oxide film, calculating a quality adjustment amount of the phosphoric acid solution determined to be necessary, adjusting quality of the phosphoric acid solution based on the quality adjustment amount calculated, and treating the wafer using the phosphoric acid solution, the quality of the phosphoric acid solution is adjusted.

It is to be understood that both the foregoing general description and the following detailed description are exemplary and explanatory only and are not restrictive of the invention, as claimed.

BRIEF DESCRIPTION OF THE DRAWINGS

The accompanying drawings, which is incorporated in and constitute a part of this specification, illustrates an embodiment of the invention and together with the description, serve to explain the principles of the invention.

DETAILED DESCRIPTION OF THE EMBODIMENTS

Figure 1:
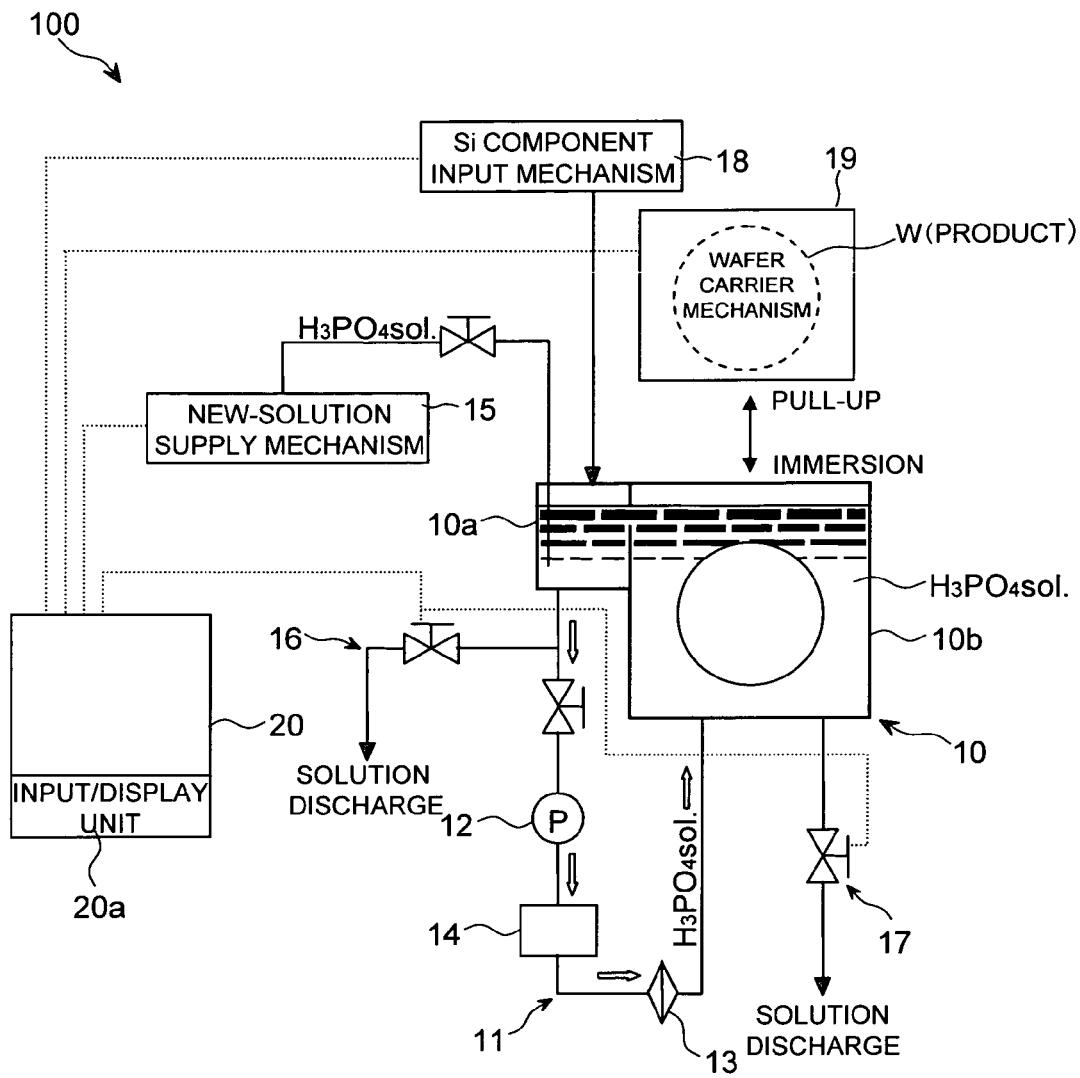
FIG. 1 is a schematic view showing configuration of a $H_3PO_4$ treatment apparatus according to one embodiment of the present invention.

Reference will now be made in detail to the present embodiment of the invention, an example of which is illustrated in the accompanying drawing. Wherever possible, the same reference numbers will be used throughout the drawing to refer to the same or like parts.

Referring now to the drawings, embodiments of the present invention will be described in detail. FIG. 1 is a schematic view showing configuration of a manufacturing apparatus for semiconductor device which allows wafers to be $H_3PO_4$ treated, hereinafter referred to as a "$H_3PO_4$ treatment apparatus".

A $H_3PO_4$ treatment apparatus 100 is so-called a batch treatment apparatus and is installed with a processing bath 10 for $H_3PO_4$ treatment of wafers with $H_3PO_4$ solution and a circulation line 11 through which $H_3PO_4$ solution circulates. The circulation line 11 is mounted with a circulation pump 12 for circulating $H_3PO_4$ solution, a filter 13 for removing dust in $H_3PO_4$ solution and a heater 14 for adjusting temperature of $H_3PO_4$ solution.

The $H_3PO_4$ treatment apparatus 100 further has mechanisms for quality adjustment of $H_3PO_4$ solution described below. The apparatus includes a new-solution supply mechanism 15 for supplying new $H_3PO_4$ solution to $H_3PO_4$ solution to be circulated, solution discharge mechanisms 16, 17 for discharging $H_3PO_4$ solution to be circulated, and a Si component input mechanism 18 serving as a mechanism for supplying Si component to $H_3PO_4$ solution to be circulated.

Further, the $H_3PO_4$ treatment apparatus 100 includes a wafer carrier mechanism 19 for carrying wafers to be subjected to $H_3PO_4$ treatment or dummy wafers for supplying Si component into/from the processing bath and a control unit 20 for controlling the whole $H_3PO_4$ treatment apparatus 100.

The processing bath 10 includes an inner tank 10a and an outer tank 10b. The inner tank 10a is installed for storing a sufficient amount of $H_3PO_4$ solution to immerse wafers for wafer immersion before $H_3PO_4$ treatment. The outer tank 10b is installed adjacent to the inner tank 10a and is connected to the circulation line 11. $H_3PO_4$ solution is made to overflow, flowed into the outer tank 10b and introduced into the circulation line 11.

The circulation line 11 is installed with the circulation pump 12, the filter 13 and the heater 14 and is connected to the bottom of the inner tank 10a. The $H_3PO_4$ solution introduced from the outer tank 10b is circulated by the circulation pump 12. Dust such as particles in $H_3PO_4$ solution is removed by the filter 13 and $H_3PO_4$ solution is adjusted to a predetermined temperature by the heater 14. The dust-removed and temperature-controlled $H_3PO_4$ solution is introduced into the inner tank 10a again by the circulation line 11.

The new-solution supply mechanism 15 is a mechanism for supplying new $H_3PO_4$ solution to circulating $H_3PO_4$ solution in the outer tank 10b and is controlled by the control unit 20. The new-solution supply mechanism 15 may be of such a structure as to supply $H_3PO_4$ solution to the inner tank 10a.

The solution discharge mechanisms 16, 17 discharges circulating $H_3PO_4$ solution and are controlled by the control unit 20. The solution discharge mechanism 16 is branched from the circulation line 11 connected to the outer tank 10b and is used in discharging a relatively small amount of $H_3PO_4$ solution. The solution discharge mechanism 17 is connected to the bottom of the inner tank 10a and is used in discharging a large amount of $H_3PO_4$ solution.

The Si component input mechanism 18a inputs Si component into circulating $H_3PO_4$ solution in the outer tank 10b and is controlled by the control unit 20. In the Si component input mechanism, 18a, silica which is an etching residue, SiN powder which is a material to be etched or $H_3PO_4$ solution having a certain Si concentration is input as a Si-containing material, to adjust Si concentration in $H_3PO_4$ solution, as needed.

The wafer carrier mechanism 19 carries wafers w to be subjected to $H_3PO_4$ treatment into/from the processing bath. It may also carry dummy wafers on which silicon-containing material or SiN having a known thickness is wholly formed as needed and is controlled by the control unit 20. This mechanism also has a function for counting with the number of wafers to be subjected to $H_3PO_4$ treatment when carrying wafers w into/from the processing bath.

When the wafers w are treated in $H_3PO_4$ solution, the number of product Lot of wafers is counted and used for calculating integrated SiN etching amount as described below. When the dummy wafers are installed into $H_3PO_4$ solution, the number of the dummy wafers needed to be installed is counted.

Figure 2:
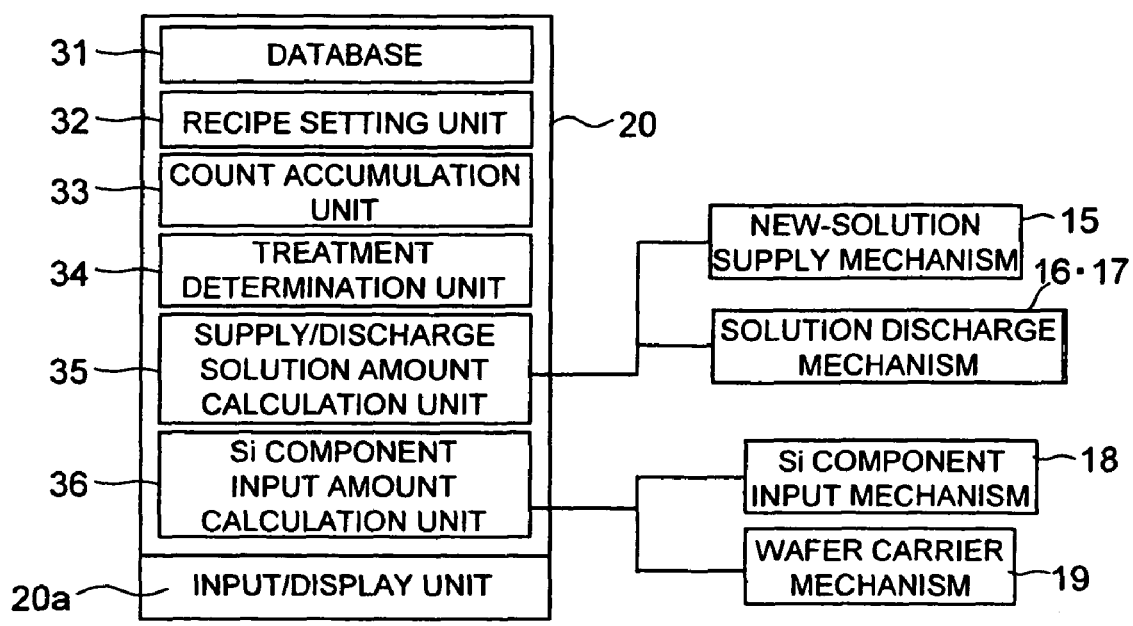
FIG. 2 is a block diagram illustrating a configuration of a control unit.

The control unit 20 is provided to control the whole $H_3PO_4$ treatment apparatus 100 including these mechanisms. FIG. 2 is a block diagram illustrating a configuration of the control unit 20.

The control unit 20 is provided with an input/display unit 20a for inputting operating conditions of the $H_3PO_4$ treatment apparatus 100, verifying the setting conditions thereof and for displaying operating states thereof. The input/display unit 20a uses, for example, a display having a touch panel function. Through the display, conditions of etching selectivity to oxide film required for etching treatment are input. In addition, determined treatment information is displayed.

The control unit 20 has a database 31, a recipe setting unit 32, a count accumulation unit 33, a treatment determination unit 34, a supply/discharge solution amount calculation unit 35 and a Si component input amount calculation unit 36. Each of these components exhibits functions implemented by a computer.

The database 31 stores previously obtained data such as the etching selectivity to oxide film to integrated SiN etching amount.

The recipe setting unit 32 is input with the etching selectivity to oxide film required for the next wafer to be treated, a wafer treatment recipe and the number of wafers to be treated. An icon for input or selection is displayed on the input/display unit 20a. Based on the input information, control information of the respective mechanisms is determined. The following description uses treatment of substantially the same type of wafers (wafers having the same SiN film thickness and aperture ratio) for convenience.

The count accumulation unit 33 counts integrated SiN etching amount in etching treatment performed with current $H_3PO_4$ solution. The integrated SiN etching amount is obtained by accumulating the product of an etching amount (depth) in one wafer (e.g. φ300 mm) and the number of treated wafers for each etching treatment. The number of treated wafers is input by the recipe setting unit or counted by the wafer carrier mechanism. Counting the integrated SiN etching amount starts when using new $H_3PO_4$ solution.

The treatment determination unit 34 determines whether input the etching selectivity to oxide film can be implemented by treatment with current $H_3PO_4$ solution. In other words, the treatment determination unit determines whether solution quality adjustment is required. At this time, the determination can be implemented by comparing integrated SiN etching amount in the current $H_3PO_4$ solution with data stored in the database 31.

The supply/discharge solution amount calculation unit 35 and the Si component input amount calculation unit 36 calculate a solution quality adjustment amount for Si concentration or the like based on determination by the treatment determination unit 34.

The supply/discharge solution amount calculation unit 35 calculates a discharge amount of $H_3PO_G$ solution by the solution discharge mechanisms 16, 17 and a supply amount of new $H_3PO_4$ solution by the new-solution supply mechanism 15 when a Si concentration in the current $H_3PO_4$ solution is to be decreased, based on the determination of the treatment determination unit 34.

The Si component input amount calculation unit 36 calculates an amount of Si-containing material to be input into the current $H_3PO_4$ solution or the number of dummy wafers to be supplied when Si concentration in the current $H_3PO_4$ solution is to be increased, based on determination of the treatment determination unit 34. The Si component input amount calculation unit 36 may have a selection function for selecting which of the Si component input mechanism 18 to use and the dummy wafer to supply.

As hardware for implementing the functions of the respective units, the control unit 20 has a first storage unit including ROM and hard disk storing data such as programs and treatment recipes for performing various types of control to be performed in the $H_3PO_4$ treatment apparatus 100 and database 31 thereof; a central processing unit (CPU) for executing such programs; an input device including input keys for inputting required data and a display; a second storage unit including such as a RAM for temporarily storing treatment data and a hard disk for storing treatment data. Mutual data exchange is performed between these components, and the functions of the respective units described above are implemented by cooperative operation between hardware and software.

Figure 3A:
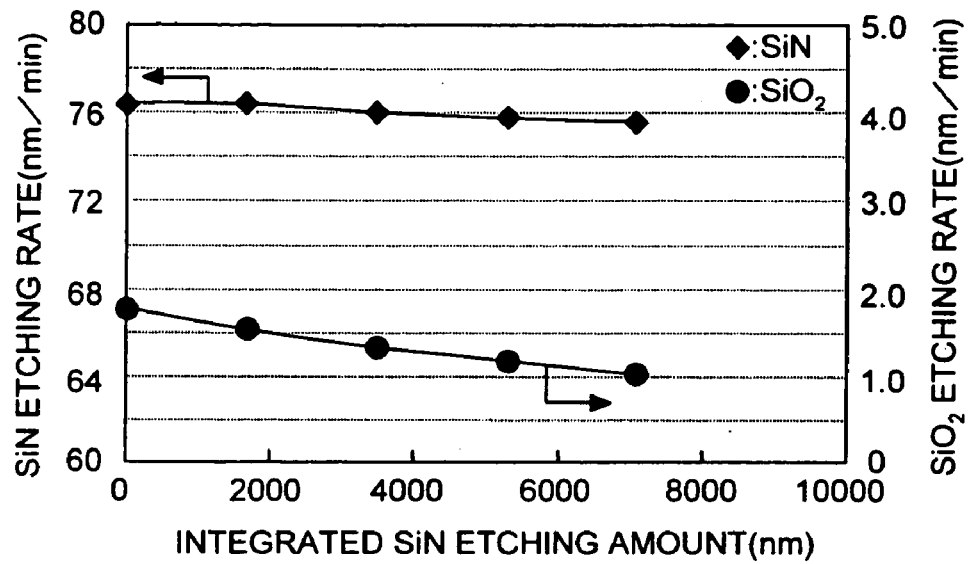
FIG. 3A, is a graph illustrating relationship data between integrated SiN etching amount and etching rate stored in a database.
Figure 3B:
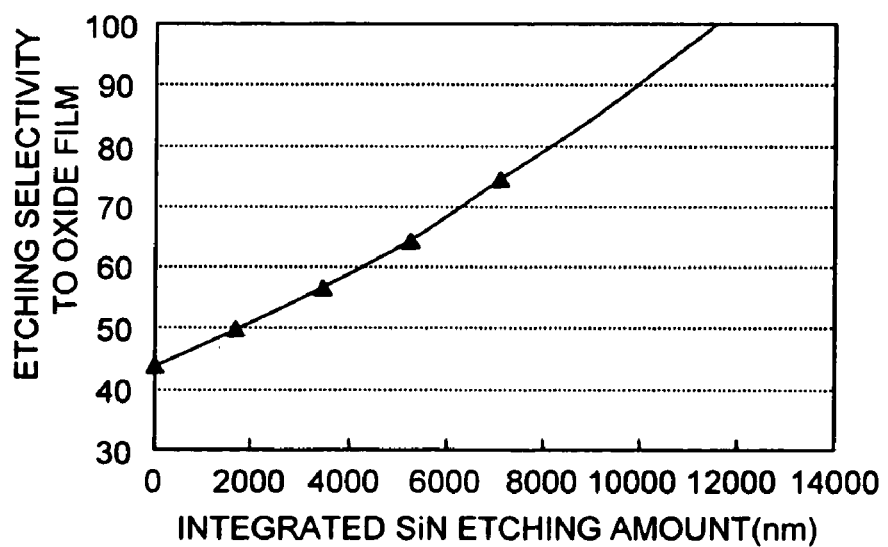
FIG. 3B is a graph illustrating relationship data between integrated SiN etching amount and etching selectivity to oxide film stored in a database.

FIGS. 3A and 3B illustrate graphed examples of data stored in the database 31. The data illustrated in FIGS. 3A and 3B are, for example, in combination of [integrated SiN etching amount and etching rate] and [integrated SiN etching amount and etching selectivity to oxide film] and are stored as digital data for each given integrated SiN etching amount (e.g. 1 nm).

These stored data are previously obtained for use in current $H_3PO_4$ treatment. In obtaining such data, actual results of $H_3PO_4$ treatment which was actually performed in the past using the $H_3PO_4$ treatment apparatus 100.

Counting the integrated SiN etching amount starts when using new $H_3PO_4$ solution. During the counting, $H_3PO_4$ solution continues to be used without an input of new $H_3PO_4$ solution into $H_3PO_4$ solution in use nor the discharge of a part thereof on purpose. During this time, the etching rate can be determined, for example, by wafer observation with Photonic film thickness analyzer or cross-section SEM.

As illustrated in FIG. 3A, as integrated SiN etching amount increases, both SiN etching rate and $SiO_2$ etching rate decrease. The ratio of a decrease in $SiO_2$ etching rate to a decrease in SiN etching rate is large. Accordingly, as illustrated in FIG. 3B, the etching selectivity to oxide film (=SiN etching rate/$SiO_2$ etching rate) increases as integrated SiN etching amount increases. In $H_3PO_4$ treatment, control of the selectivity is important in addition to control of the etching rate.

For example, in setting the etching selectivity to oxide film to 50 to 60, $H_3PO_4$ solution having an actual result of 2,000 to 4,200 nm in integrated SiN etching amount is necessary. When the integrated SiN etching amount of $H_3PO_4$ solution at present is in excess of 5,000 nm, wafer treatment cannot be performed using this $H_3PO_4$ solution. Accordingly, there is need of returning the state of current $H_3PO_4$ solution to a state of $H_3PO_4$ solution having an actual result of approximately 2,000 to 4,200 nm in integrated SiN etching amount.

Accordingly, a part of current $H_3PO_4$ solution is discharged and new $H_3PO_4$ solution is added. The addition of the new $H_3PO_4$ solution allows the state of $H_3PO_4$ solution to be returned to a state having small integrated SiN etching amount. The integrated SiN etching amount is a dissolved Si amount and therefore such an operation itself is the same as an operation for adjusting Si concentration of $H_3PO_4$ solution.

Specifically, in adjusting $H_3PO_4$ solution having integrated SiN etching amount of 5,000 nm to $H_3PO_4$ solution having integrated SiN etching amount of 2,000 nm, it is sufficient to discard 60% of $H_3PO_4$ solution in use and then add new $H_3PO_4$ solution by the same amount as the discharge amount.

On the other hand, when it is necessary that the etching selectivity to oxide film is, for example, at least 50, solution having an actual result of 2,000 nm or more in integrated SiN etching amount is required. Accordingly, new $H_3PO_4$ solution having no actual result cannot perform wafer treatment.

To change a state of current $H_3PO_4$ solution to a state of $H_3PO_4$ solution having an actual result of approximately 2,000 nm in integrated SiN etching amount, a Si component needs to be supplied. Accordingly, Si-containing material is input or dummy wafer is supplied into current $H_3PO_4$ solution.

Supplying a Si component allows new $H_3PO_4$ solution to have the same solution quality as the $H_3PO_4$ solution which has treated a certain number of wafers. Addition amount of the Si-containing material or the number of dummy wafers to be treated can be obtained, based on the integrated SiN etching amount.

Accordingly, the discharge amount from current $H_3PO_4$ solution, the addition amount of new $H_3PO_4$ solution, and the addition amount of Si component to be supplied can be determined from the integrated SiN etching amount without need of measurement of actual Si concentration in $H_3PO_4$ solution.

Referring next to a flowchart illustrated in FIG. 4, description will be made on a $H_3PO_4$ treatment flow with the $H_3PO_4$ treatment apparatus 100. The time point when $H_3PO_4$ treatment of a predetermined number of wafers is completed with new $H_3PO_4$ solution is taken as a start point (ST1). At this time, counted integrated SiN etching amount is taken as (N). No adjustment of $H_3PO_4$ solution is made until ST1 has been reached.

A selectivity to oxide film ($S_1$) required for the next wafer to be treated are input from the input/display unit 20a (ST2).

The treatment determination unit 34 determines the selectivity to oxide film ($S_2$) when $H_3PO_4$ treatment is performed with current $H_3PO_4$ solution, using the database (ST3).

The treatment determination unit 34 compares the selectivity to oxide film ($S_1$) and ($S_2$) with each other and determines whether the etching selectivity to oxide film ($S_2$) is within the allowable range of the etching selectivity to oxide film ($S_1$) (ST4).

If the determination is YES in ST4, wafer treatment can be implemented with current $H_3PO_4$ solution and therefore $H_3PO_4$ treatment (ST5) is performed, without adjustment of H$_3$PO$_4$ solution. The integrated SiN etching amount (N) is updated (ST6) and then the process returns to ST1.

If the determination is NO in ST4, the determination unit determines whether Si concentration in current H$_3$PO$_4$ solution is to be lowered (ST7).

The case where the determination is YES in ST7 is a case where SiN etching amount with the current H$_3$PO$_4$ solution needs to be small amount. Therefore, the supply/discharge solution amount calculation unit 35 determines integrated SiN etching amount (n) of H$_3$PO$_4$ solution to be adjusted, from the etching selectivity to oxide film (S$_1$), using the database 31 (ST8).

The supply/discharge solution amount calculation unit 35 further determines a discharge amount of current H$_3$PO$_4$ solution and an input amount of new H$_3$PO$_4$ solution from the integrated SiN etching amount (N) and the integrated SiN etching amount (n) of H$_3$PO$_4$ solution to be adjusted. Based on the determined amounts, H$_3$PO$_4$ solution is automatically adjusted by the new-solution supply mechanism 15 and the discharge solution mechanisms 16, 17 (ST9). Preferably, circulation of H$_3$PO$_4$ solution through the circulation line 11 is performed for a certain amount of time, so that the composition and temperature of the adjusted H$_3$PO$_4$ solution are homogenized.

The H$_3$PO$_4$ solution adjusted in this way substantially becomes a H$_3$PO$_4$ solution having an actual result of the integrated SiN etching amount (n). Accordingly, the previous integrated SiN etching amount (N) is replaced with integrated SiN etching amount (n) (ST10). That is, "N" is substituted by "n". Then H$_3$PO$_4$ treatment is performed (ST11). Further, integrated SiN etching amount (N) is updated (ST12) and the process returns to ST1.

The case where the determination is NO in ST7 is a case where integrated SiN etching amount with current H$_3$PO$_4$ solution needs to be larger amount. Therefore, the Si component input amount calculation unit 36 determines integrated SiN etching amount (n') of H$_3$PO$_4$ solution to be adjusted, from the etching selectivity to oxide film (S$_1$), using the database 31 (ST13).

The Si component input amount calculation unit 36 further calculates an Si amount to be input into current H$_3$PO$_4$ solution from the integrated SiN etching amount (N), (n'). Next, Si input means (either one or both of Si component input mechanism 18 and dummy wafer) is determined as needed, and adjustment of H$_3$PO$_4$ solution by the determined means is performed (ST14).

The H$_3$PO$_4$ solution adjusted in this way substantially becomes a H$_3$PO$_4$ solution having an actual result of the integrated SiN etching amount (n'). Accordingly, the previous integrated SiN etching amount (N) is replaced with integrated SiN etching amount (n') (ST15). That is, "N" is substituted by "n". Then H$_3$PO$_4$ treatment is performed (ST16). Further, integrated SiN etching amount (N) is updated (ST17) and the process returns to ST1.

In the above description, H$_3$PO$_4$-treated wafers having the same SiN film thickness and aperture ratio are used for convenience, but in practice, various types of wafers, such as a wafer having different SiN film thickness, a wafer having different aperture ratio, a wafer having SiN on both faces or single face, a wafer formed with SiN film as a masking material in dry process, a wafer having different SiN volume and a wafer having different Si amount dissolved from the wafer, are treated as needed.

In treating such wafers having different modes, current H$_3$PO$_4$ solution is adjusted so that a desired the etching selectivity to oxide film are obtained. Accordingly, exact grasp of integrated SiN etching amount in current H$_3$PO$_4$ solution is required.

As comparison data stored in the database 31, data describing a relationship between [integrated SiN etching amount per predetermined area and the etching selectivity to oxide film] are prepared. The integrated SiN etching amount per predetermined area refers to, specifically, the integrated SiN etching amount per predetermined area (nm/cm$^2$) or an integrated SiN etching amount (nm/wafer) per single area of one wafer (φ200 mm or φ300 mm).

Such a data can be determined, for example, by correcting the integrated SiN etching amount of the data illustrated in FIGS. 3A and 3B in consideration of an aperture ratio in a wafer. Data obtained in advance by treating various types of wafers may also be used.

The integrated SiN etching amount in current H$_3$PO$_4$ solution is grasped as integrated SiN etching amount per predetermined area. As one of the methods, there is proposed a method of providing a function for including the SiN film amount practically etched in a treatment recipe as information. Specifically, parameters for automatically calculating SiN etching amount per predetermined area, such as film thickness, aperture ratio (mask area in the case of etching mask) and presence of back film are provided. Hence, SiN etching amount per predetermined area in one wafer is exactly grasped, depending upon a selected recipe.

Further, as parameters, information of the number of wafers to be treated is used. This information can be obtained by inputting the number of wafers to be treated or counted result by a wafer carrier mechanism 19. By using the parameters, integrated SiN etching amount per predetermined area can be obtained. Such a function may be provided in the recipe setting unit 32 and the count accumulation unit 33.

There may occur a case where a part of parameters for automatically calculating SiN etching amount per predetermined area included in a selected treatment recipe are different from actual parameters of wafers to be treated. Such treatment recipe parameters can be corrected through the input/display unit 20a.

Referring to a flowchart in FIG. 5, brief description will be made on actual wafer treatment when such integrated SiN etching amount per predetermined area is used.

To sequentially perform a plurality of H$_3$PO$_4$ treatments, a recipe is preselected according to the sequence made and the content thereof is stored. Each recipe includes a required etching selectivity to oxide film.

Figure 5:
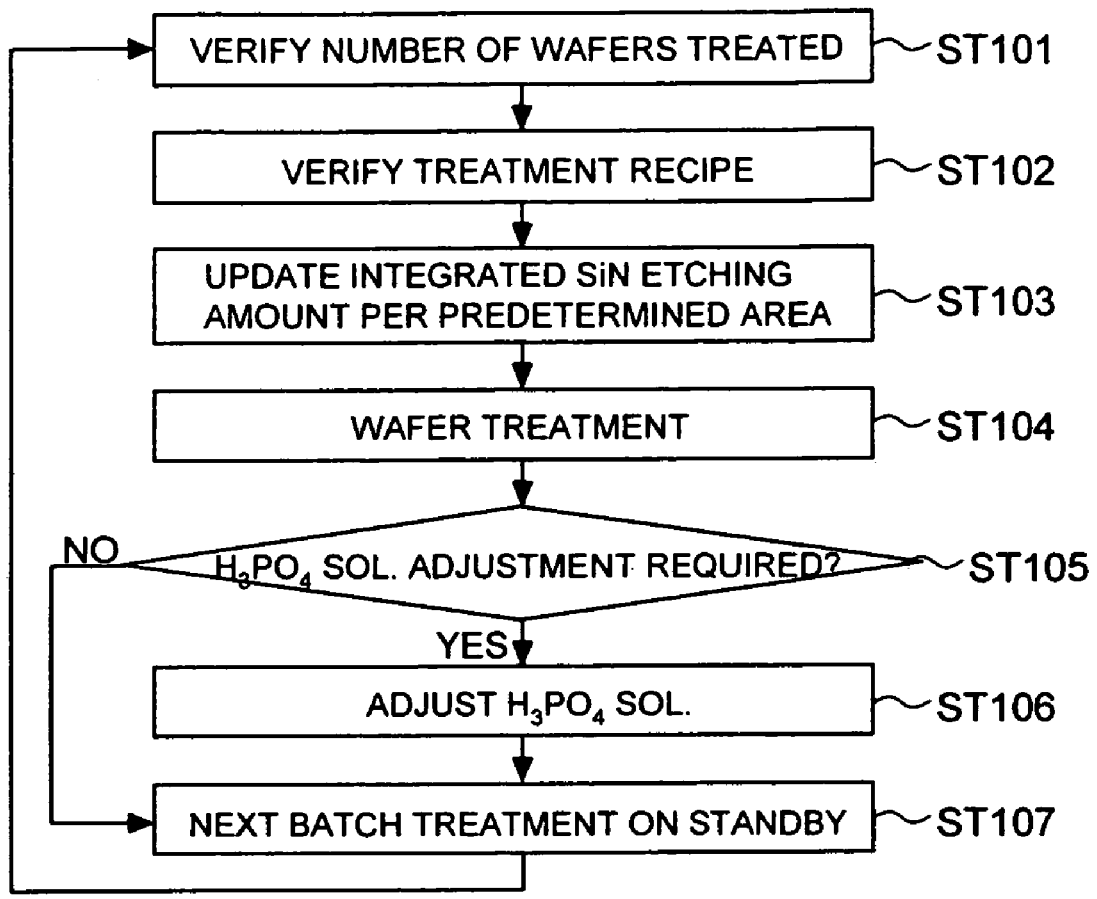
FIG. 5 is a flowchart illustrating another example of treatment with a $H_3PO_4$ treatment apparatus.

In FIG. 5, a state in which predetermined H$_3$PO$_4$ treatments have been performed and adjustment of H$_3$PO$_4$ solution has been completed as needed is taken as a start point. It is verified through a display of the input/display unit 20a that the number of wafers to be actually treated meets the previously input number of wafers (ST101). When any changes need to be made, the number of wafers to be actually treated is input, and a treatment recipe is verified (ST102). Hence, the integrated SiN etching amount per predetermined area is updated (ST103) and H$_3$PO$_4$ treatment is started (ST104).

Figure 4:
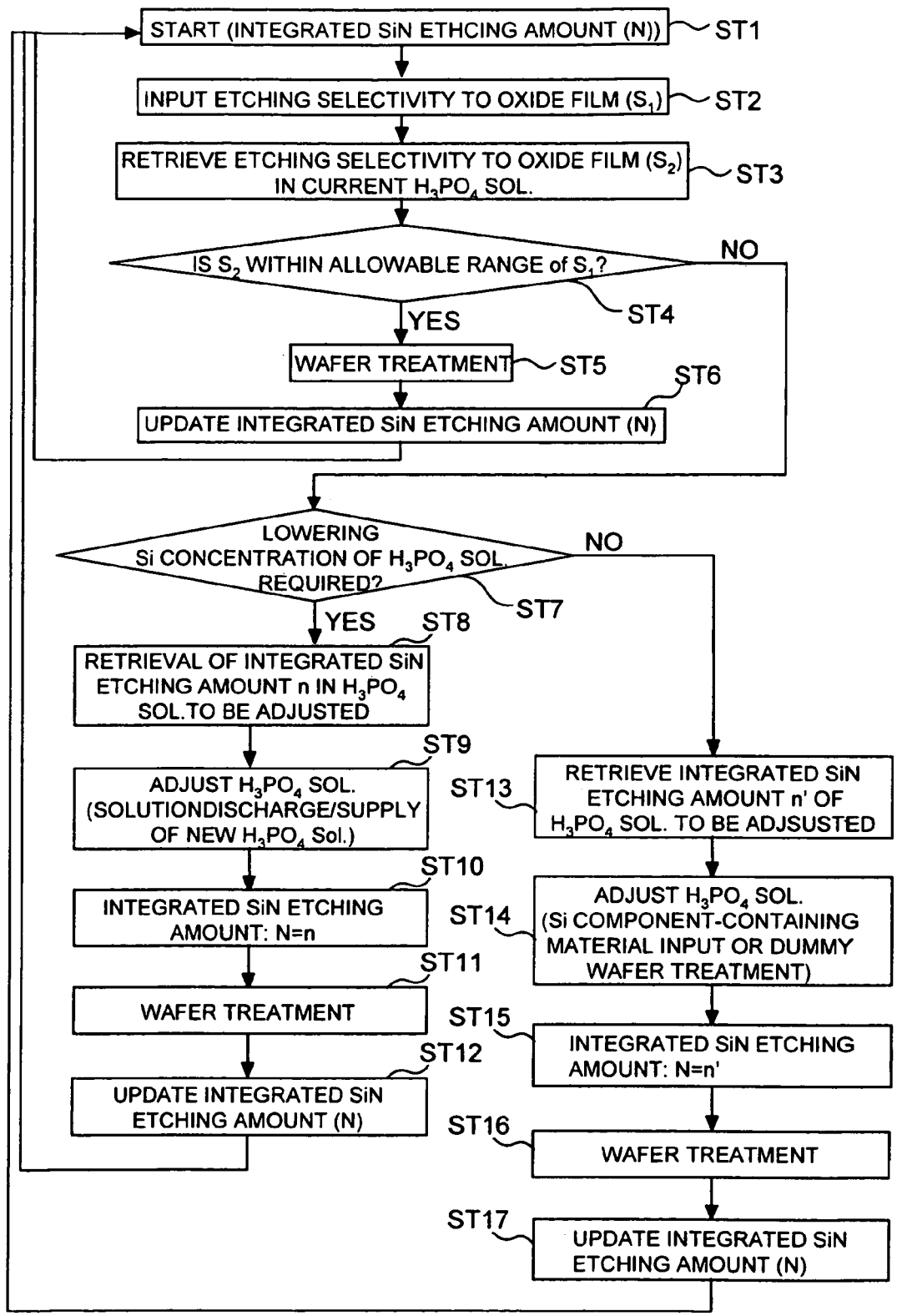
FIG. 4 is a flowchart illustrating an example of treatment with a $H_3PO_4$ treatment apparatus.

In the treatment according to the flowchart in FIG. 4, integrated SiN etching amount with H$_3$PO$_4$ solution at that point in time is updated after completion of predetermined batch treatment. The integrated SiN etching amount per predetermined area may be updated before actual batch treatment in the same way as the treatment according to the flowchart in FIG. 5.

After completion of the batch treatment in ST104, it is determined whether or not the etching selectivity to oxide film included in a recipe for the next batch treatment can be obtained with $H_3PO_4$ solution after. Completion of the batch treatment in ST104. Specifically, it is determined whether or not the quality adjustment of $H_3PO_4$ solution ($H_3PO_4$ solution discharge/additional supply of new $H_3PO_4$ solution or Si component addition) is necessary (ST105).

When the quality adjustment of $H_3PO_4$ solution is necessary, the adjustment (ST106) is automatically performed, thus leading to a next batch treatment standby state (ST107). On the other hand, when $H_3PO_4$ solution adjustment is not necessary, the process goes into a next batch treatment standby state without adjustment. Then, the process returns to ST101.

The embodiment of the present invention has been described above, but the present invention is not limited thereto. For example, $H_3PO_4$ solution adjustment to a substantially same state before starting respective $H_3PO_4$ treatments allows continuous $H_3PO_4$ treatment under the same conditions.

For quality adjustment of $H_3PO_4$ solution, Si component has been added, but adjustment by HF addition is also applicable.

As described above in detail, the present embodiment enables easy adjustment, by in-situ technique, of $H_3PO_4$ solution capable of obtaining a required etching selectivity to oxide film for $H_3PO_4$ treatment without need of an expensive system. Accordingly, stable and etching selectivity to oxide film can be obtained in $H_3PO_4$ treatment. Variations in characteristics of wafers subjected to $H_3PO_4$ treatment and semiconductor devices formed therewith can be suppressed, so that the yield thereof can be boosted.

Other embodiments of the invention will be apparent to those skilled in the art from consideration of the specification and practice of the invention disclosed herein. It is intended that the specification and examples be considered as exemplary only, with a true-scope and spirit of the invention being indicated by the following claims.

What is claimed is:

1. A manufacturing method for a semiconductor device treating a SiN film formed on a wafer is treated with phosphoric acid solution, comprising:
   calculating integrated SiN etching amount of phosphoric acid solution provided for treatment of the wafer;
   determining necessity of quality adjustment of the phosphoric acid solution based on correlations between the integrated SiN etching amount calculated and etching selectivity to oxide film;
   calculating a quality adjustment amount of the phosphoric acid solution determined to be necessary;
   adjusting quality of the phosphoric acid solution based on the quality adjustment amount calculated; and
   treating the wafer using the phosphoric acid solution, the quality of the phosphoric acid solution is adjusted.

2. The manufacturing method for a semiconductor device according to claim 1, wherein the integrated SiN etching amount is calculated based on a recipe of wafers treated with the phosphoric acid solution and the number of the wafers.

3. The manufacturing method for a semiconductor device according to claim 2, wherein the recipe is prepared in plurality and the integrated SiN etching amount is calculated according to the respective recipes.

4. The manufacturing method for a semiconductor device according to claim 2, wherein the recipe has parameters of thickness of SiN films formed on the wafers, an aperture ratio of the SiN films, presence of a back SiN film and number of the wafers to be treated.

5. The manufacturing method for a semiconductor device according to claim 1, wherein the integrated SiN etching amount is determined as a SiN film thickness per unit area of a wafer.

6. The manufacturing method for a semiconductor device according to claim 1, wherein the necessity of the quality adjustment of the phosphoric acid solution is determined, by comparing correlation between integrated SiN etching amount and etching selectivity to oxide film stored in advance in a database with the integrated SiN etching amount calculated.

7. The manufacturing method for a semiconductor device according to claim 6, the necessity of the quality adjustment of the phosphoric acid solution is determined, by obtaining etching selectivity to oxide film estimated from the integrated SiN etching amount calculated based on the database and determining if the etching selectivity to oxide film is within a predetermined range.

8. The manufacturing method for a semiconductor device according to claim 6, the necessity of the quality adjustment of the phosphoric acid solution is determined, by calculating integrated SiN etching amount required for treatment from a required range of the etching selectivity to oxide film based on the database and comparing the integrated SiN etching amount with the integrated SiN etching amount calculated required for the treatment.

9. The manufacturing method for a semiconductor device according to claim 1, wherein the quality of the phosphoric acid solution is adjusted by discharging the phosphoric acid solution and supplying new phosphoric acid solution.

10. The manufacturing method for a semiconductor device according to claim 9, wherein the quality of the phosphoric acid solution is adjusted by supplying a silicon component into the phosphoric acid solution.

11. The manufacturing method for a semiconductor device according to claim 9, wherein the quality of the phosphoric acid solution is adjusted by supplying a dummy wafer formed with a predetermined silicon-containing material or a predetermined SiN film into the phosphoric acid solution.

12. The manufacturing method for a semiconductor device according to claim 9, wherein the phosphoric acid solution is circulated.

* * * * *